United States Patent
Lu et al.

(10) Patent No.: US 8,093,678 B2
(45) Date of Patent: Jan. 10, 2012

(54) SEMICONDUCTOR DEVICE AND METHOD OF FABRICATING THE SAME

(75) Inventors: Ching-Shan Lu, Tainan (TW);
Feng-Liang Lai, Tainan (TW);
Shean-Ren Horng, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 861 days.

(21) Appl. No.: 11/783,067

(22) Filed: Apr. 5, 2007

(65) Prior Publication Data

US 2008/0246111 A1    Oct. 9, 2008

(51) Int. Cl.
*H01L 21/762* (2006.01)
*H01L 21/70* (2006.01)

(52) U.S. Cl. ............ 257/510; 257/506; 257/E21.549; 257/E21.244; 257/E21.548; 438/435; 438/424; 438/436

(58) Field of Classification Search ............ 257/E21.549, 257/510
See application file for complete search history.

(56) References Cited

U.S. PATENT DOCUMENTS

| 5,561,073 | A | * | 10/1996 | Jerome et al. | 438/404 |
| 5,989,978 | A | * | 11/1999 | Peidous | 438/436 |
| 6,143,624 | A | * | 11/2000 | Kepler et al. | 438/433 |
| 6,242,323 | B1 | * | 6/2001 | Ishitsuka et al. | 438/435 |
| 6,326,282 | B1 | * | 12/2001 | Park et al. | 438/424 |
| 6,465,866 | B2 | * | 10/2002 | Park et al. | 257/510 |
| 7,029,987 | B2 | | 4/2006 | Kim | |
| 2006/0014362 | A1 | * | 1/2006 | Lee | 438/435 |

* cited by examiner

*Primary Examiner* — Zandra Smith
*Assistant Examiner* — Tsz Chiu
(74) *Attorney, Agent, or Firm* — Birch, Stewart, Kolasch & Birch, LLP (57) ABSTRACT

A semiconductor device. The device includes an active region isolated by an isolation structure on a substrate, and a dielectric layer overlying the active region and the isolation structure. The dielectric layer comprises a lower part overlying the active region beyond the boundary of the active region and the isolation structure, and a protruding part overlying the boundary of the active region and the isolation structure.

21 Claims, 7 Drawing Sheets

SEMICONDUCTOR DEVICE AND METHOD OF FABRICATING THE SAME

BACKGROUND OF THE INVENTION

1. Field of the Invention

The invention relates to semiconductor technology and in particular to devices, for low gate voltage and higher drain breakdown performance.

2. Description of the Related Art

A complete circuit, such as an integrated circuit (IC), usually comprises thousands of transistors. A shallow trench isolation (STI) serves as an isolation region to prevent short circuit between two adjacent transistors. Such STI is formed by producing a shallow trench in a semiconductor substrate by anisotropically etching the semiconductor substrate using a silicon nitride layer as a hard mask, and then filling the shallow trench with an insulating layer.

The characteristics of STIs depend on whether the STI has a liner layer. However, defects, such as shallow pitting, may occur in an STI with no liner layer, due to subsequent oxidation. The defect degrades the electrical characteristics of the resultant device, and causes leakage current in a junction region, i.e., adversely affects the isolation of the device. In addition, since the shallow trench formed in the substrate is angulated at its top corner, a gate oxide layer grows insufficiently or non-uniformly during subsequent thermal oxidation. Hence, the portion of the gate oxide layer formed on the top corner of the shallow trench is very thin. As a result, breakdown voltage of the gate oxide layer on the active region becomes lower, and a parasitic current occurs in a transistor, thereby degrading the operability of the resultant device.

A semiconductor device is disclosed to improve the thickness distribution of the gate oxide proximate to the STI to improve breakdown voltage performance. The device comprises a step shallow trench structure. This structure effectively works in uniform gate oxide thickness but the gate oxide thickness is still thinner than other parts thereof. Thus, more effective structures and processes for improvement of the breakdown voltages are needed.

BRIEF SUMMARY OF THE INVENTION

The invention provides semiconductor devices and methods of fabricating the same providing improvement of the breakdown voltages associated with the isolation regions.

The invention provides a semiconductor device comprising an active region isolated by an isolation structure on a substrate, and a dielectric layer overlying the active region and the isolation structure. The dielectric layer comprises a lower part overlying the active region beyond the boundary of the active region and the isolation structure, and a protruding part overlying the boundary of the active region and the isolation structure.

The invention further provides a semiconductor device comprising an active region isolated by an isolation structure on a substrate, and a dielectric layer overlying the active region and the isolation structure. The dielectric layer comprises a first part overlying the boundary of the active region and the isolation structure, and a second part overlying the active region beyond the boundary of the active region and the isolation structure. The first part of the dielectric layer comprises a substantially curved surface profile. The second part of the dielectric layer comprises a substantially flat surface profile.

The invention further provides a semiconductor device comprising an active region isolated by an isolation structure on a substrate, a first dielectric layer, and a second dielectric layer. The first dielectric layer overlies the active region and the isolation structure. The first dielectric layer comprises a first part, comprising a substantially stepped profile, overlying the boundary of the active region and the isolation structure, and a second part, comprising a thickness-constant profile, overlying the isolation structure beyond the boundary of the active region and the isolation structure. The second dielectric layer overlies the first dielectric layer and the active region.

The invention further provides a method of fabricating a semiconductor device. First, a substrate comprising an active region isolated by an isolation structure is provided. The substrate further comprises a first dielectric layer overlying the active region and the isolation structure, and a second dielectric layer overlying the first dielectric layer. A patterned mask layer is then formed overlying the substrate. The patterned mask layer covers the second dielectric layer overlying the isolation structure, and the boundary of the active region and the isolation structure, exposing the second dielectric layer overlying the active region beyond the boundary. Next, the exposed second dielectric layer is removed and the underlying first dielectric layer is thinned. Next, the patterned mask layer is trimmed back, removing the pattern mask layer overlying the boundary of the active region and the isolation structure, exposing the second dielectric layer overlying the boundary of the active region and the isolation structure. Further, the exposed second dielectric layer is removed, forming a step structure of the first dielectric layer overlying the boundary of the active region and the isolation structure. Finally, a third dielectric layer is formed overlying the first dielectric layer. The third dielectric layer overlying the step structure protrudes from other parts thereof and the first dielectric layer overlying the isolation structure.

The invention further provides a method of fabricating a semiconductor device. First, a substrate comprising an active region isolated by an isolation structure is provided. The substrate further comprises a first dielectric layer overlying the active region and the isolation structure, and a second dielectric layer overlying the first dielectric layer. A patterned mask layer is then formed overlying the substrate. The patterned mask layer covers the second dielectric layer overlying the isolation structure, and the boundary of the active region and the isolation structure, exposing the second dielectric layer overlying the active region beyond the boundary. Next, the exposed second dielectric layer is removed and the underlying first dielectric layer is thinned. Further, the second dielectric layer overlying the boundary of the active region and the isolation structure is laterally removed, forming a step structure of the first dielectric layer overlying the boundary of the active region and the isolation structure. Finally, a third dielectric layer is formed overlying the first dielectric layer. The third dielectric layer overlying the step structure protrudes from other parts thereof and the first dielectric layer overlying the isolation structure.

The invention further provides a method of fabricating a semiconductor device. First, a substrate comprising an active region isolated by an isolation structure is provided. The substrate further comprises a first dielectric layer overlying the active region and the isolation structure, and a second dielectric layer overlying the first dielectric layer. A first patterned mask layer is then formed overlying the substrate. The first patterned mask layer covers parts of the second dielectric layer overlying the isolation structure, exposing the boundary of the active region and the isolation structure, and the second dielectric layer overlying the active region. Next, the exposed second dielectric layer is removed, exposing the underlying first dielectric layer. Next, the first patterned mask layer is removed. Next, a second patterned mask layer is formed overlying the substrate, the second patterned mask layer covers the first dielectric layer overlying the boundary of the active region and the isolation structure, exposing the first dielectric layer overlying the active region beyond the boundary. Next, the exposed first dielectric layer is removed. Further, the second patterned mask layer is removed, exposing the first dielectric layer overlying the boundary of the active region and the isolation structure. Finally, a third dielectric layer is formed overlying the active region and the exposed first dielectric layer. The third dielectric layer overlying the exposed first dielectric layer protrudes from other parts thereof and the first dielectric layer overlying the isolation structure.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1A, 1B, 2A, and 2B are cross-sections of semiconductor devices of preferred embodiments of the invention. The semiconductor device comprises an active region 101 isolated by an isolation structure 102 on a substrate 100, and a dielectric layer 150 overlying the active region 101 and the isolation structure 102.

The substrate 100 can comprise semiconductor materials such as silicon, germanium, silicon germanium, compound semiconductor, or other known semiconductor materials, but comprises silicon in this embodiment. In some cases, the substrate 100 may be an N-type or P-type silicon wafer. The active region 101 may be a high voltage (HV) device region, low voltage (LV) device region, or other type of device region as desired. In this embodiment the active region 101 is an HV device region, and another active region 103 is an LV device region. The isolation structure 102 may be shallow trench isolation (STI), field oxide (FOX), or other isolation structure, but is STI in this embodiment, comprising a shallow trench 105 and an insulating material 110 filled therein. The insulating material 110 may be high density plasma oxide (HDP SiO2), undoped silicon glass (USG), or other insulating materials as desired. In some cases, the semiconductor device may further comprise a dielectric layer 130 overlying the isolation structure 102 beyond a boundary 104 of the active region 101 and the isolation structure 102. In this embodiment, as shown in the in areas 1, 2 in FIGS. 1A, 1B, 2A and 2B, the active region 101 comprises an angulated surface profile 101a in proximity to the isolation structure 102, extending to the isolation structure 102, the isolation structure 102 comprises an angulated surface profile 102a in proximity to the active region 102, extending to the active region 102, and the boundary 104 comprises the extension of the angulated surface profiles 101a and 102a of the active region 101 and isolation structure 102.

Figure 1A:
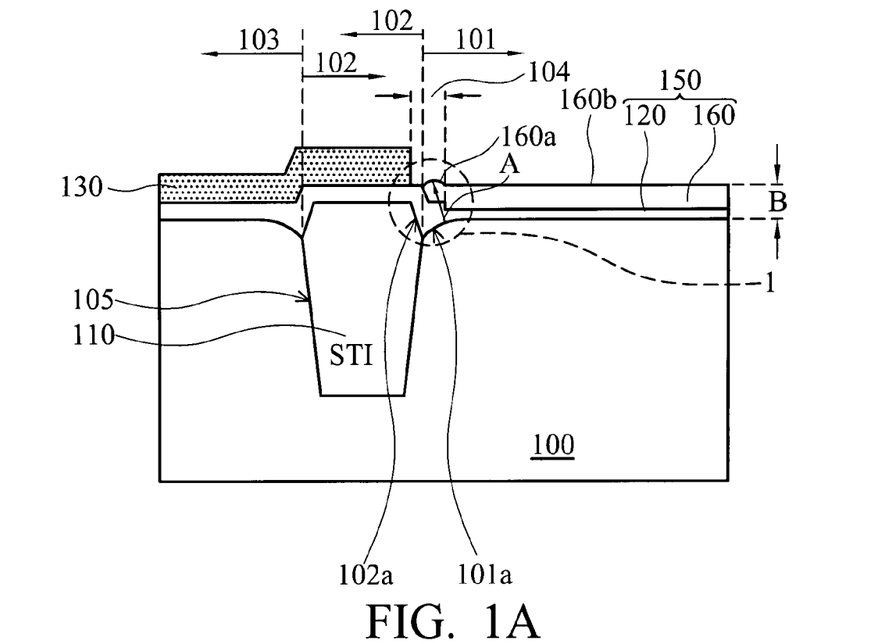
FIGS. 1A, 1B, 2A, and 2B are cross-sections of semiconductor devices of preferred embodiments of the invention.
Figure 1B:
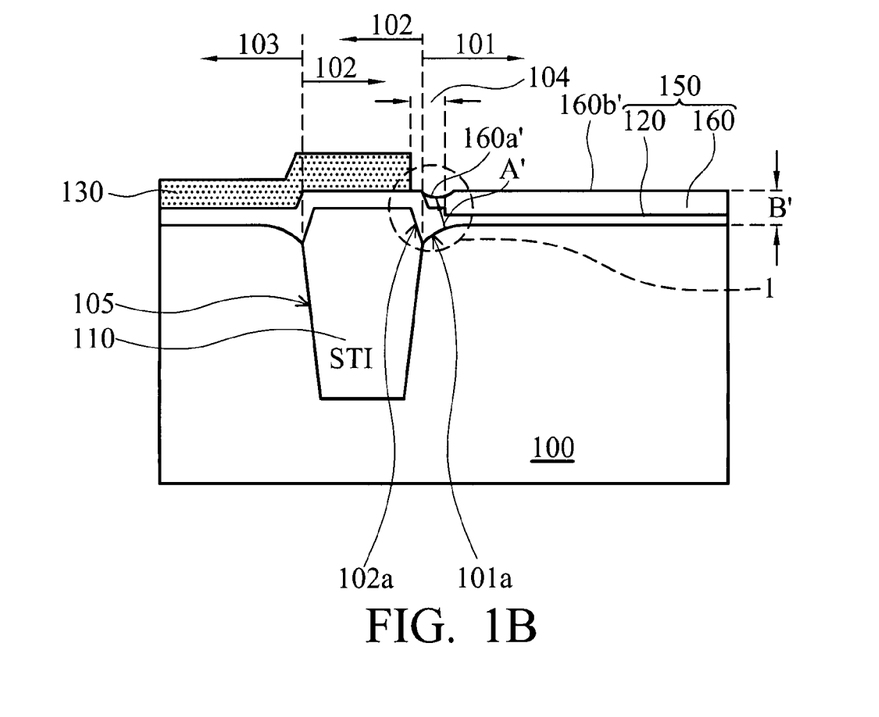

In FIGS. 1A, 1B, 2A, and 2B, the dielectric layer 150 comprises a dielectric layer 120 and a dielectric layer 160. The different distributions of the dielectric layers 120 and 160 shown in FIGS. 1A, 1B, 2A, and 2B is due to different process flow as subsequently described. The dielectric layer 120 comprises a first part and a second part. The first part of the dielectric layer 120 comprises a substantially stepped profile and overlies the boundary 104 of the active region 101 and the isolation structure 102. The second part of the dielectric layer 120 comprises a thickness-constant profile and overlies the isolation structure 102 beyond the boundary 104 of the active region 101 and the isolation structure 102. In some embodiments, such as shown in FIGS. 1A and 1B, the dielectric layer 120 may further comprise a third part, which is thinner than the second part of the dielectric layer 120, comprising a substantially thickness-constant profile and overlying the active region 101 beyond the boundary 104 of the active region 101 and the isolation structure 104.

Figure 2A:
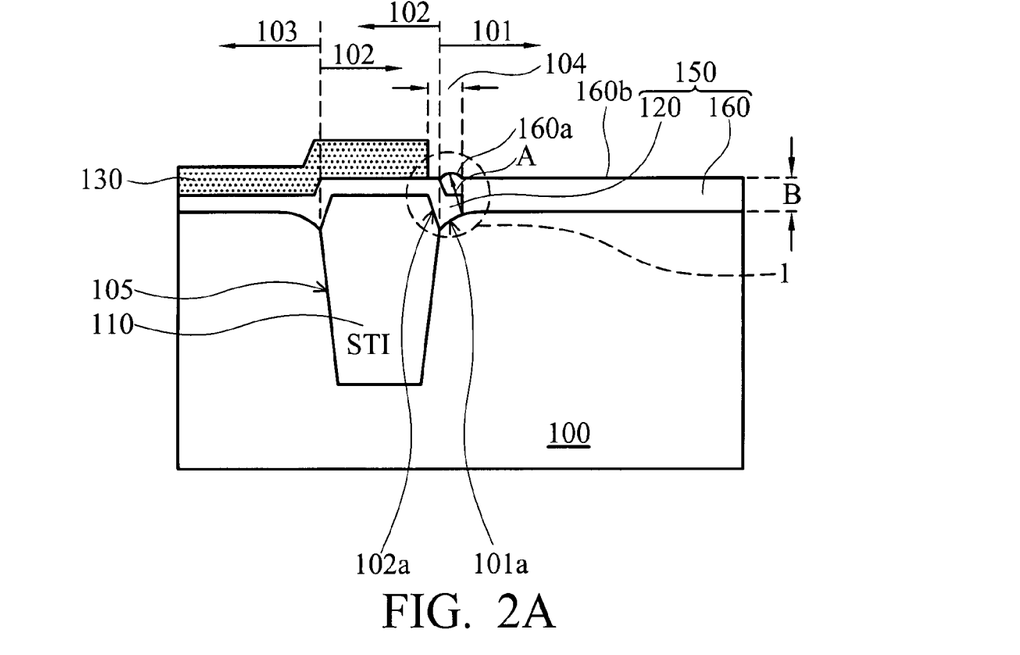

In the embodiments shown in FIGS. 1A and 2A, the dielectric layer 150 comprises a first part 160a and a second part 160b. The first part 160a comprises a substantially curved surface profile, and the second part 160b comprises a substantially flat surface profile. The first part 160a overlies the boundary 104 of the active region 101 and the isolation structure 102. The second 160b overlies the active region 101 beyond the boundary 104 of the active region 101 and the isolation structure 102.

In FIGS. 1A and 2A, the letter "A" indicates the thickness of the first part 160a of the dielectric layer 150, or alternatively, the combination thickness of the first part of the dielectric layer 120 and the first part of the dielectric layer 160. In FIG. 1A, the letter "B" indicates the thickness of the second part 160b of the dielectric layer 150, or alternatively, the combination thickness of the third part of the dielectric layer 120 and the second part of the dielectric layer 160. In FIG. 2A, the letter "B" indicates the thickness of the second part 160b of the dielectric layer 150, or alternatively, the thickness of the second part of the dielectric layer 160.

In the embodiments shown in FIGS. 1A and 2A, the first part 160a protrudes from other parts thereof, such as the second part 160b. Thus, the first part 160a acts as a protruding part, and the second part 160b acts as a lower part. The protruding part 160a of the dielectric layer 150 is preferably above at least one of the angulated surface profiles 101a and 102a of the active region 101 and isolation structure 102. The protruding part 160a is preferably approximately 10 Å higher than the neighboring part of the dielectric layer 150 overlying the active region 101. Thus, the protruding part 160a overlying the boundary 104 of the active region 101 and isolation structure 102 can increase the breakdown voltage when the dielectric layer 150 is utilized as a gate dielectric, preventing parasitic current in a transistor and improving the electrical performance of the semiconductor device.

In some embodiments, the dielectric layer 120, such as the second part thereof, is between 30 and 110 Å thick, the dielectric layer 160, such as the second part thereof, is between 15 and 100 Å thick, and the dielectric layer 150 is thicker than other parts thereof, such as the second part 160b. In some cases, the protruding part 160a is between 1.1 and 4.0 times thicker than the neighboring part of the dielectric layer 150 overlying the active region 101, such as the lower part 160b. In FIG. 1A, for example, the thickness A of the first part 160a of the dielectric layer 150 is between 1.1 and 4.0 times of the thickness B of the second part 160b of the dielectric layer 150, or alternatively, the combination thickness A of the first part of the dielectric layer 120 and the first part of the dielectric layer 160 is between 1.1 and 4.0 times of the combination thickness B of the third part of the dielectric layer 120 and the second part of the dielectric layer 160. In FIG. 2A, for example, the thickness A of the first part 160a of the dielectric layer 150 is between 1.1 and 4.0 times of the thickness B of the second part 160b of the dielectric layer 150, or alternatively, the combination thickness A of the first part of the dielectric layer 120 and the first part of the dielectric layer 160 is between 1.1 and 4.0 times of the thickness B of the second part of the dielectric layer 160. Thus, the protruding part 160a overlying the boundary 104 of the active region 101 and isolation structure 102 can increase the breakdown voltage when the dielectric layer 150 is utilized as a gate dielectric, preventing parasitic current in a transistor and improving the electrical performance of the semiconductor device.

Figure 2B:
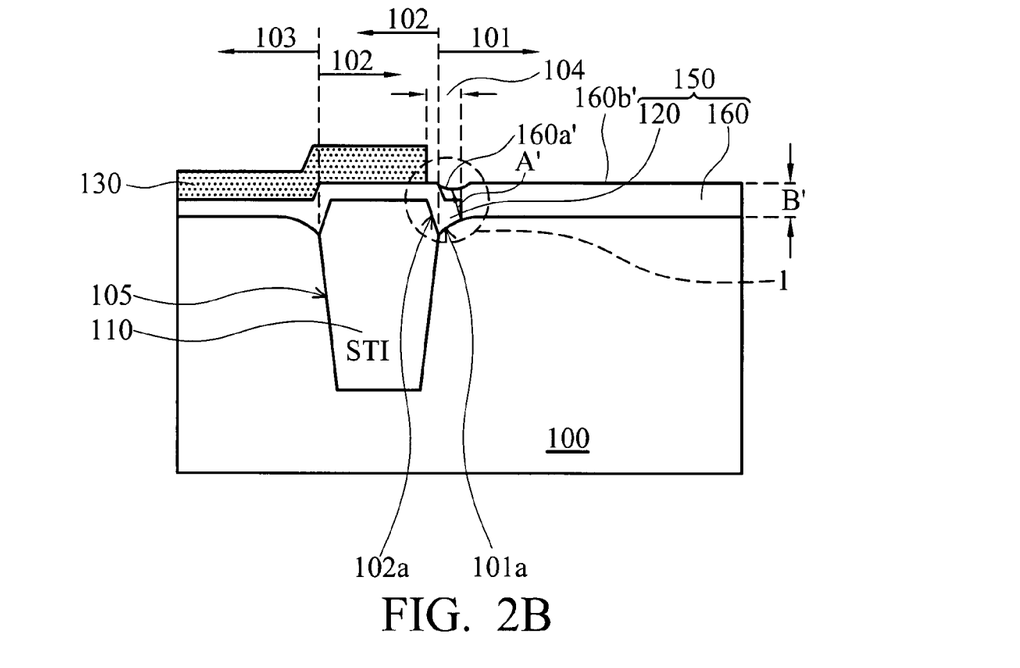

In the embodiments shown in FIGS. 1B and 2B, the dielectric layer 150 comprises a first part 160a' and a second part 160b'. The first part 160a' comprises a substantially curved surface profile, and the second part 160b' comprises a substantially flat surface profile. The first part 160a' overlies the boundary 104 of the active region 101 and the isolation structure 102. The second 160b' overlies the active region 101 beyond the boundary 104 of the active region 101 and the isolation structure 102.

In FIGS. 1B and 2B, the letter "A'" indicates the thickness of the first part 160a' of the dielectric layer 150, or alternatively, the combination thickness of the first part of the dielectric layer 120 and the first part of the dielectric layer 160. In FIG. 1B, the letter "B'" indicates the thickness of the second part 160b' of the dielectric layer 150, or alternatively, the combination thickness of the third part of the dielectric layer 120 and the second part of the dielectric layer 160. In FIG. 2B, the letter "B'" indicates the thickness of the second part 160b' of the dielectric layer 150, or alternatively, the thickness of the second part of the dielectric layer 160.

In the embodiments shown in FIGS. 1B and 2B, the first part 160a' is concave relative to other parts thereof, such as the second part 160b'. The first part 160a' of the dielectric layer 150 is preferably above at least one of the angulated surface profiles 101a and 102a of the active region 101 and isolation structure 102.

In some embodiments, the dielectric layer 120, such as the second part thereof, is between 100 and 250 Å thick, and the dielectric layer 160, such as the second part thereof, is between 100 and 1500 Å thick. In FIG. 1B, for example, the thickness A' of the first part 160a' of the dielectric layer 150 is between 0.65 and 2.8 times of the thickness B' of the second part 160b' of the dielectric layer 150, or alternatively, the combination thickness A' of the first part of the dielectric layer 120 and the first part of the dielectric layer 160 is between 0.65 and 2.8 times of the combination thickness B of the third part of the dielectric layer 120 and the second part of the dielectric layer 160. In FIG. 2B, for example, the thickness A' of the first part 160a' of the dielectric layer 150 is between 0.65 and 2.8 times of the thickness B' of the second part 160b' of the dielectric layer 150, or alternatively, the combination thickness A' of the first part of the dielectric layer 120 and the first part of the dielectric layer 160 is between 0.65 and 2.8 times of the thickness B' of the second part of the dielectric layer 160. Thus, the first part 160a' overlying the boundary 104 of the active region 101 and isolation structure 102 can increase the breakdown voltage when the dielectric layer 150 is utilized as a gate dielectric, preventing parasitic current in a transistor and improving the electrical performance of the semiconductor device.

In the application of a device capable of withstanding large transients such as a power device or an ESD (electrostatic discharge) protection device, for example, the dielectric layer 150 preferably comprises oxides. In this embodiment, the dielectric layer 120 is pad oxide, and the dielectric layer 160 is thermal oxide. In other embodiments, the dielectric layers 120 and 160 may be other known dielectric materials as desired.

Figure 3A:
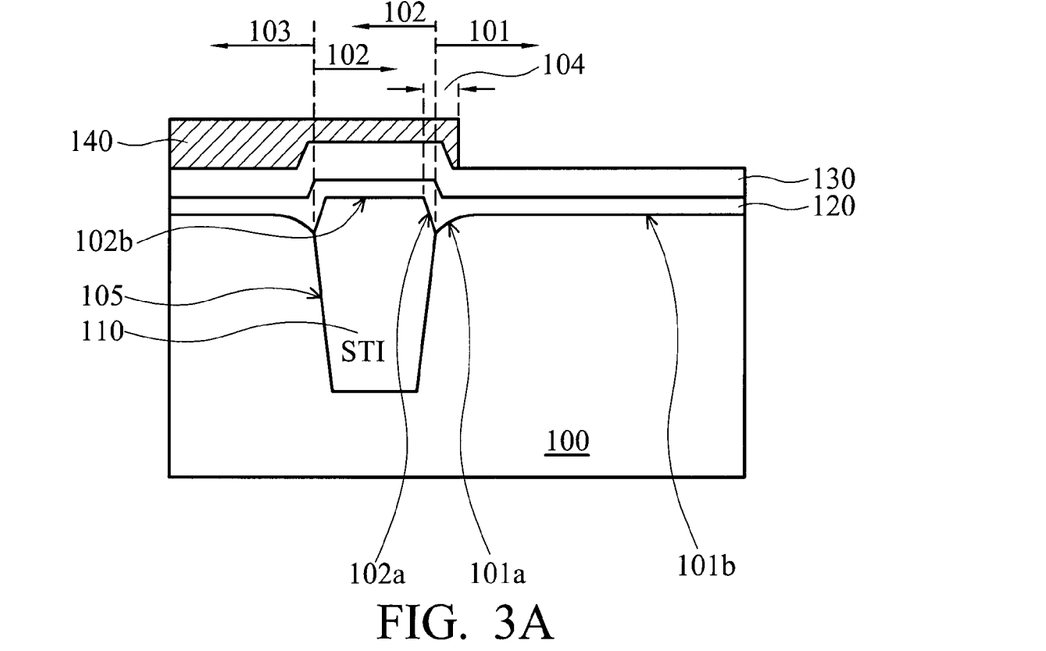
FIGS. 3A through 3C are cross-sections of a preferred fabrication method of the semiconductor device shown in FIG. 1.
Figure 3B:
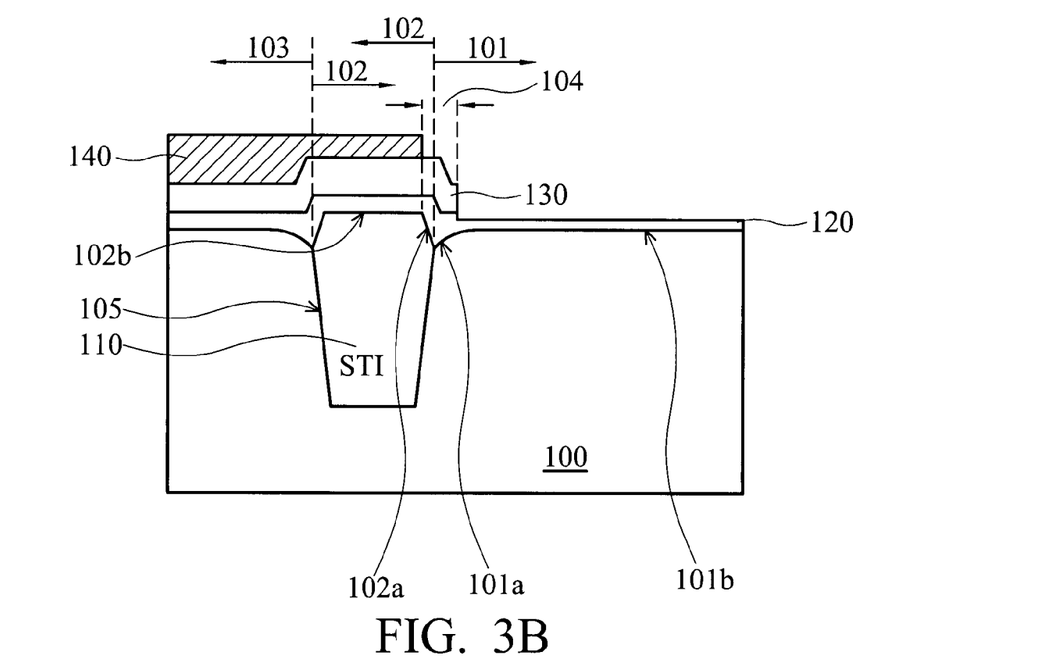
Figure 3C:
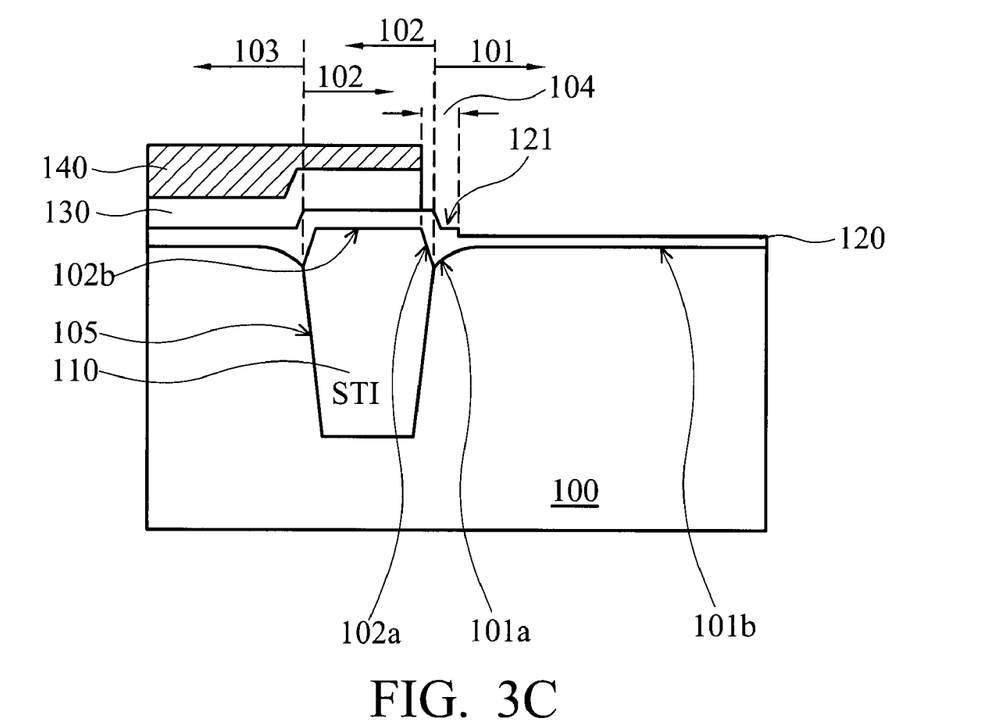

FIGS. 3A through 3C are cross-sections of a preferred fabrication method of the semiconductor device shown in FIG. 1

In FIG. 3A, first, a substrate 100 comprising an active region 101 isolated by an isolation structure 102 is provided. The substrate 100 further comprises a first dielectric layer 120 overlying the active region 101 and the isolation structure 102, and a second dielectric layer 130 overlying the first dielectric layer 120. In this embodiment, the surface profile 102b of the isolation structure 102 is substantially higher than the surface profile 101b of the active region 101 in addition to the angulated surface profiles 101a and 102a thereof, and the first and second dielectric layers 120 and 130 substantially conformally overlie the substrate 100. In other embodiments, the surface profile 102b of the isolation structure 102 may be substantially as high as, or lower than the surface profile 101b of the active region 101 in addition to the angulated surface profiles 101a and 102a thereof.

The first and second dielectric layer 120 and 130 preferably comprise some etching selectivity with each other under a predetermined etchant for the subsequent steps. In this embodiment, the first dielectric layer 120 is pad oxide, and the second dielectric layer 130 is nitride. In other embodiments, the first and second dielectric layers 120 and 130 may be other dielectric materials comprising some etching selectivity with each other under a specific etchant. A patterned mask layer 140 is then formed overlying the substrate 100. The patterned mask layer 140 covers the second dielectric layer 130 overlying the isolation structure 102, and the boundary 104 of the active region 101 and the isolation structure 102, exposing the second dielectric layer 130 overlying the active region 101 beyond the boundary 104.

In FIG. 3B, next, the exposed second dielectric layer 130 is removed and the underlying first dielectric layer 120 is thinned by dry etching in this embodiment. Next, the patterned mask layer 140 is trimmed back, removing the pattern mask layer 140 overlying the boundary 104 of the active region 101 and the isolation structure 102, exposing the second dielectric layer 130 overlying the boundary 104. In this embodiment, the patterned mask layer 140 comprises patterned resist layer such as photoresist, and the trim-back of the patterned mask layer 140 is preferably performed by plasma etching. In other embodiments, the trim-back of the patterned mask layer 140 may be performed by wet etching or other appropriate technology.

In FIG. 3C, the exposed second dielectric layer 130 is removed, forming a step structure 121 of the first dielectric layer 120 overlying the boundary 104 of the active region 101 and the isolation structure 102. In this embodiment, the step, structure 121 has two steps due to the higher surface profile 102b of the isolation structure 102 and the conformal first dielectric layer 121.

Finally, a third dielectric layer 160 is formed overlying the exposed first dielectric layer 120. The third dielectric layer 160 overlying the step structure 121 protrudes from, or, alternatively, is higher than other parts thereof and the first dielectric layer 120 overlying the isolation structure 102 as shown in FIG. 1. In this embodiment, the third dielectric layer 160 is formed by thermal oxidation to the underlying substrate 100, and thus, comprises oxide. In other embodiments, the third dielectric layer 160 is formed by known deposition process, and comprises any known dielectric layers as desired. The patterned mask layer 140 is preferably removed after formation of the step structure 121. In this embodiment, the patterned mask layer 140 is removed by ashing utilizing oxygen plasma before formation of the third dielectric layer 160.

Figure 4A:
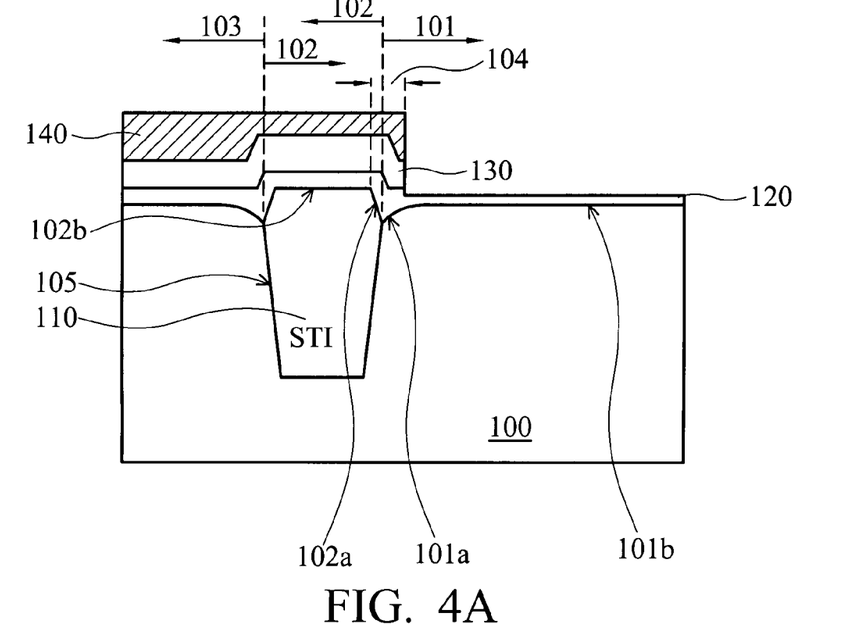
FIGS. 4A and 4B are cross-sections of another preferred fabrication method of the semiconductor device shown in FIG. 1.
Figure 4B:
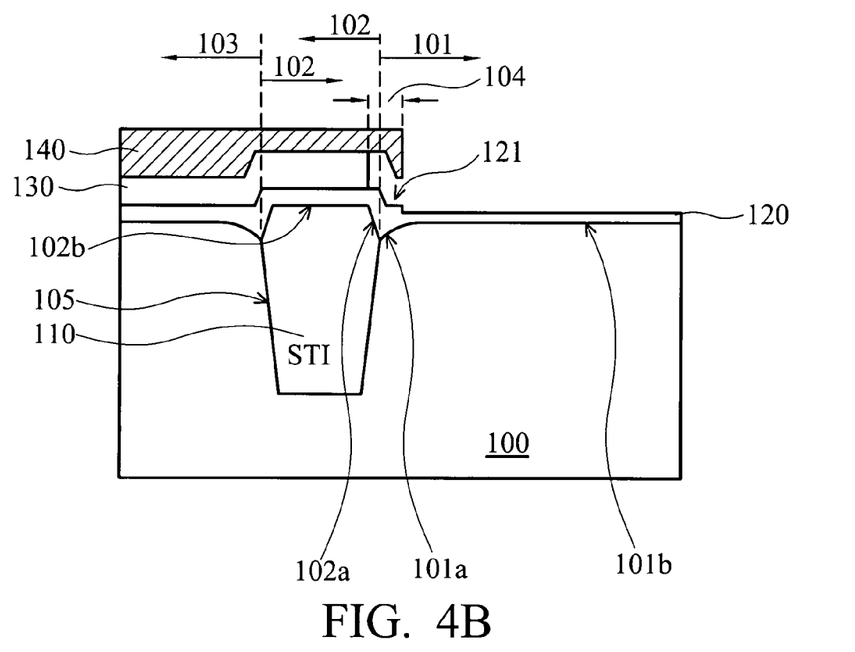

FIGS. 4A and 4B are cross-sections of another preferred fabrication method of the semiconductor device shown in FIG. 1

In FIG. 4A, following that shown in FIG. 3A, the exposed second dielectric layer 130 is removed and the underlying first dielectric layer 120 is thinned by dry etching in this embodiment. In other embodiments, the exposed dielectric layer 130 may be removed by wet etching or other appropriate process.

In FIG. 4B, the second dielectric layer 130 overlying the boundary 104 of the active region 101 and the isolation structure 102 is laterally removed, forming a step structure 121 of the first dielectric layer 120 overlying the boundary 104. In this embodiment, lateral removal of the second dielectric layer 130 overlying the boundary 104 is performed by wet etching. In other embodiments, the second dielectric layer 130 overlying the boundary 104 may be removed by other lateral removal technologies. Further, the step structure 121 has two steps due to the higher surface profile 102b of the isolation structure 102 and the conformal first dielectric layer 121 in this embodiment.

Finally, a third dielectric layer 160 is formed overlying the exposed first dielectric layer 120. The third dielectric layer 160 overlying the step structure 121 protrudes from, or, alternatively, is higher than other parts thereof and the first dielectric layer 120 overlying the isolation structure 102 as shown in FIG. 1. In this embodiment, the third dielectric layer 160 is formed by thermal oxidation to the underlying substrate 100, and thus, comprises oxide. In other embodiments, the third dielectric layer 160 is formed by known deposition process, and comprises any known dielectric layers as desired. The patterned mask layer 140 is preferably removed after formation of the step structure 121. In this embodiment, the patterned mask layer 140 is removed by ashing utilizing oxygen plasma before formation of the third dielectric layer 160.

Figure 5A:
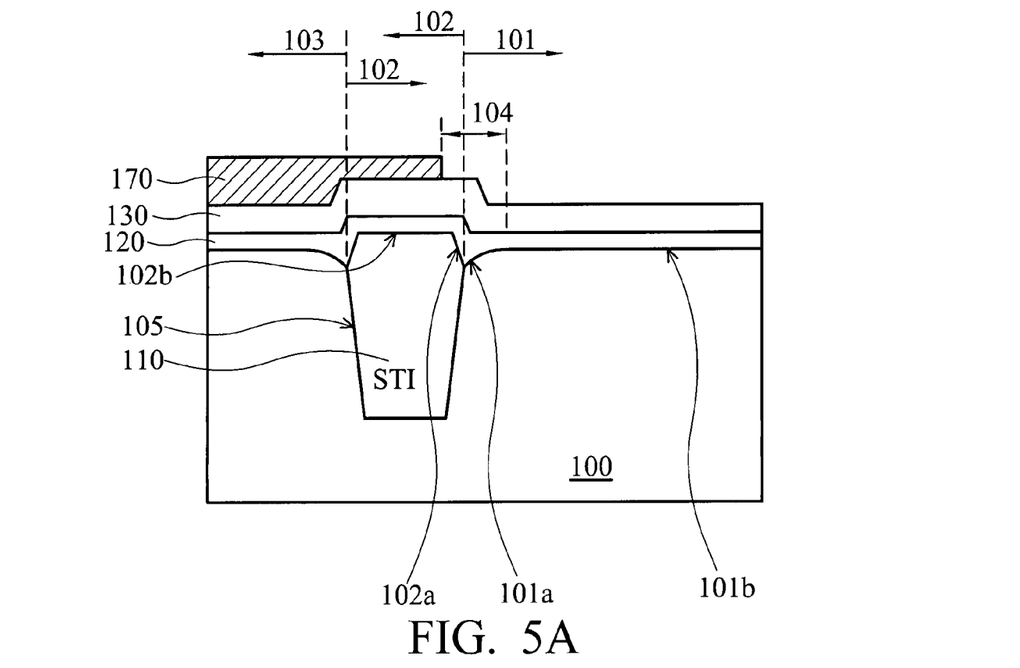
FIGS. 5A through 5C are cross-sections of a preferred fabrication method of the semiconductor device shown in FIG. 2.
Figure 5B:
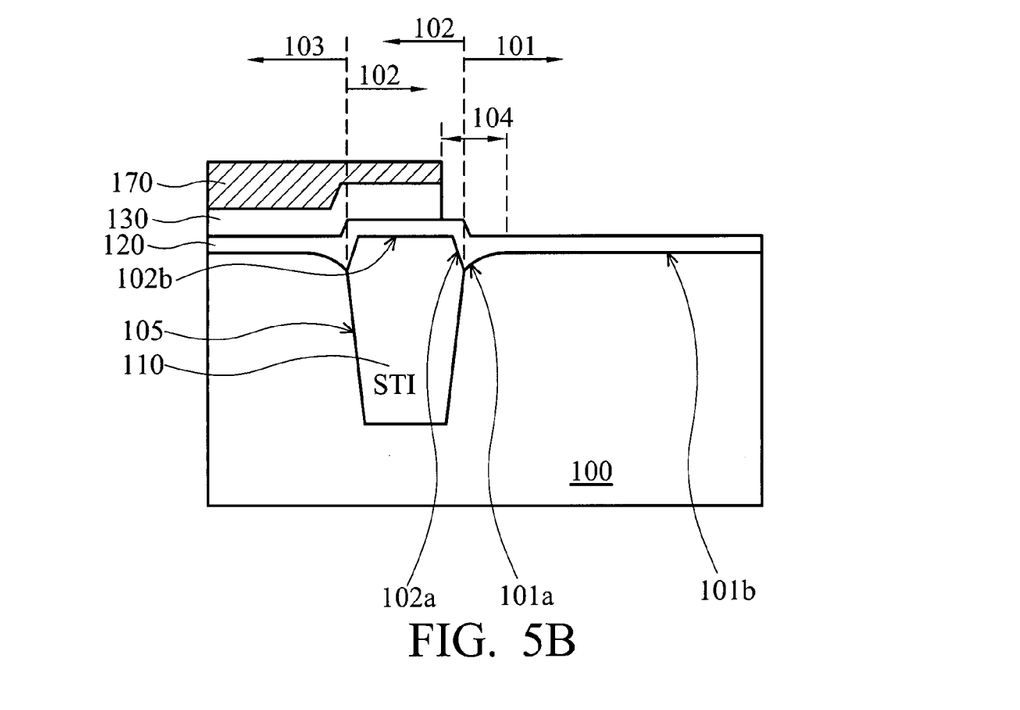
Figure 5C:
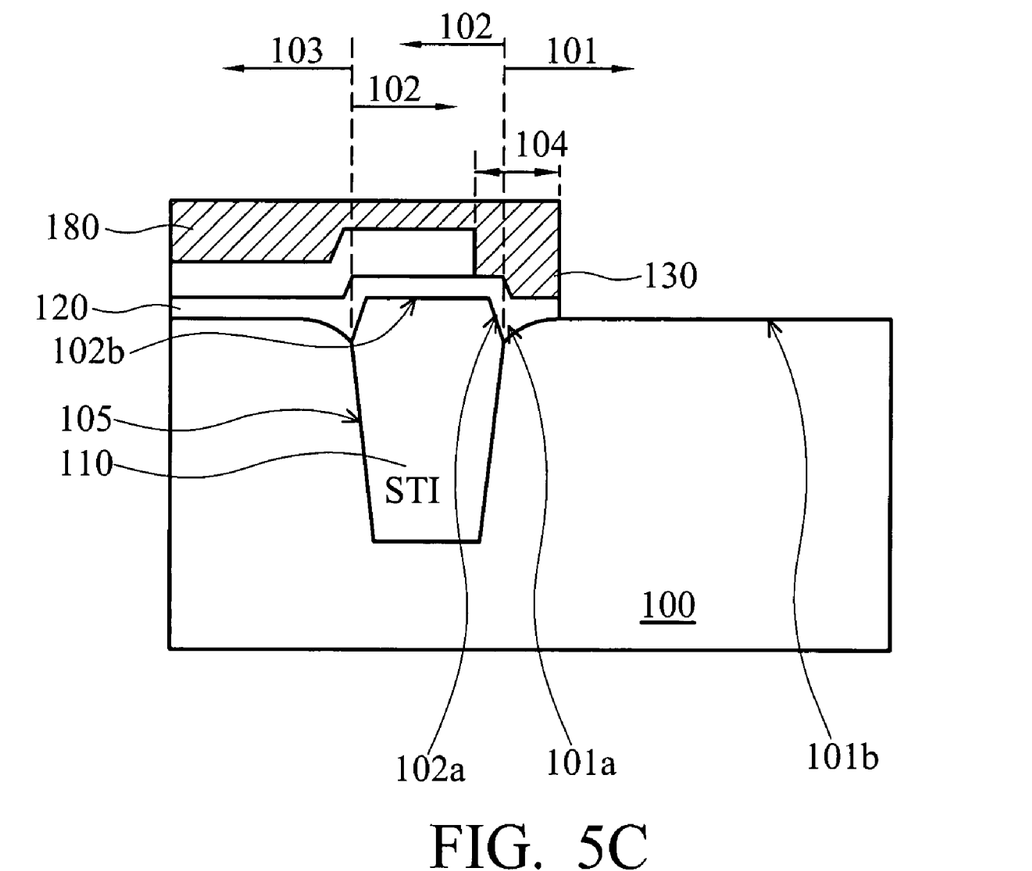

FIGS. 5A through 5C are cross-sections of a preferred fabrication method of the semiconductor device shown in FIG. 2.

In FIG. 5A, first, a substrate 100 comprising an active region 101 isolated by an isolation structure 102 is provided. The substrate 100 further comprises a first dielectric layer 120 overlying the active region 101 and the isolation structure 102, and a second dielectric layer 130 overlying the first dielectric layer 120. In this embodiment, the surface profile 102b of the isolation structure 102 is substantially higher than the surface profile 101b of the active region 101 in addition to the angulated surface profiles 101a and 102a thereof, and the first and second dielectric layers 120 and 130 substantially conformally overlie the substrate 100. In other embodiments, the surface profile 102b of the isolation structure 102 may be substantially as high as, or lower than the surface profile 101b of the active region 101 in addition to the angulated surface profiles 101a and 102a thereof.

The first and second dielectric layer 120 and 130 preferably comprise some etching selectivity with each other under a predetermined etchant for the subsequent steps. In this embodiment, the first dielectric layer 120 is pad oxide, and the second dielectric layer 130 is nitride. In other embodiments, the first and second dielectric layers 120 and 130 may be other dielectric materials comprising some etching selectivity with each other under a specific etchant. A first patterned mask layer 170 is then formed overlying the substrate 100. The first patterned mask layer 170 covers parts of the second dielectric layer 130 overlying the isolation structure 102, exposing the boundary 104 of the active region 101 and the isolation structure 102, and the second dielectric layer 130 overlying the active region 101.

In FIG. 5B, next, the exposed second dielectric layer 130 is removed, exposing the underlying first dielectric layer 120 by dry etching in this embodiment. In other embodiments, the exposed second dielectric layer 130 may be removed by wet etching or other appropriate technologies.

In FIG. 5C, next, the first patterned mask layer 170 is removed by ashing utilizing oxygen plasma, for example. In some embodiments, the first patterned mask layer 170 may be removed by dry etching, wet etching, or other appropriate technologies. Next, a second patterned mask layer 180 is formed overlying the substrate, 100, the second patterned mask layer 180 covers the first dielectric layer 120 overlying the boundary 104 of the active region 101 and the isolation structure 102, exposing the first dielectric layer 120 overlying the active region 101 beyond the boundary 104. In this embodiment, the second patterned mask layer 180 further covers the remaining second dielectric layer 130. Next, the exposed first dielectric layer 120 is removed by dry etching in this embodiment. In other embodiments, the exposed first dielectric layer 120 may be removed by wet etching or other appropriate technologies.

Further, the second patterned mask layer 180 is removed by ashing utilizing oxygen plasma, for example, exposing the first dielectric layer 120 overlying the boundary 104 of the active region 101 and the isolation structure 102. In some embodiments, the second patterned mask layer 180 may be removed by dry etching, wet etching, or other appropriate technologies. Finally, a third dielectric layer 160 is formed overlying the exposed first dielectric layer 120. The third dielectric layer 160 overlying the step structure 121 protrudes from, or, alternatively, is higher than other parts thereof and the first dielectric layer 120 overlying the isolation structure 102 as shown in FIG. 2. In this embodiment, the third dielectric layer 160 is formed by thermal oxidation to the underlying substrate 100, and thus, comprises oxide. In other embodiments, the third dielectric layer 160 is formed by known deposition process, and comprises any known dielectric layers as desired.

While the invention has been described by way of example and in terms of preferred embodiment, it is to be understood that the invention is not limited thereto. To the contrary, it is intended to cover various modifications and similar arrangements (as would be apparent to those skilled in the art).

Therefore, the scope of the appended claims should be accorded the broadest interpretation so as to encompass all such modifications and similar arrangements.

What is claimed is:

1. A semiconductor device, comprising:
   an active region isolated by an isolation structure on a substrate; and
   a first dielectric layer covering the isolation structure, said first dielectric having a stepped profile at the boundary of the active region and the isolation structure, and said first dielectric layer physically contacting a top surface of the substrate;
   a second dielectric layer overlying the active region and the isolation structure, wherein the second dielectric layer comprises:
   a protruding part overlying the boundary of the active region and the isolation structure; and
   a lower part overlying the active region beyond the boundary of the active region and the isolation structure,
   wherein the protruding part of the second dielectric layer is stacked above the stepped profile of the first dielectric layer.

2. The device as claimed in claim 1, wherein
   the active region comprises an angulated surface profile in proximity to the isolation structure, extending to the isolation structure;
   the isolation structure comprises an angulated surface profile in proximity to the active region, extending to the active region; and
   the boundary of the active region and the isolation structure comprises the extension of the angulated surface profiles of the active region and isolation structure.

3. The device as claimed in claim 1, wherein
   the active region comprises an angulated surface profile in proximity to the isolation structure, extending to the isolation structure;
   the isolation structure comprises an angulated surface profile in proximity to the active region, extending to the active region; and
   the protruding part of the dielectric layer is above at least one of the angulated surface profiles of the active region and isolation structure.

4. The device as claimed in claim 1, wherein the protruding part of the second dielectric layer is approximately 10 Å higher than the lower part of the second dielectric layer.

5. The device as claimed in claim 1, wherein the protruding part of the second dielectric layer is between 1.1 and 4.0 times thicker than the lower part of the second dielectric layer.

6. A semiconductor device, comprising:
   an active region isolated by an isolation structure on a substrate;
   a first dielectric layer covering the isolation structure, said first dielectric having a stepped profile at the boundary of the active region and the isolation structure, and said first dielectric layer physically contacting a top surface of the substrate; and
   a second dielectric layer overlying the active region and the isolation structure, wherein the second dielectric layer comprises:
   a first part, comprising a substantially curved surface profile, overlying the boundary of the active region and the isolation structure; and
   a second part, comprising a substantially flat surface profile, overlying the active region beyond the boundary of the active region and the isolation structure,
   wherein the curved surface profile of the second dielectric is stacked above the stepped profile of the first dielectric layer.

7. The device as claimed in claim 6, wherein
   the active region comprises an angulated surface profile in proximity to the isolation structure, extending to the isolation structure;
   the isolation structure comprises an angulated surface profile in proximity to the active region, extending to the active region; and
   the boundary of the active region and the isolation structure comprises the extension of the angulated surface profiles of the active region and isolation structure.

8. The device as claimed in claim 6, wherein
   the active region comprises an angulated surface profile in proximity to the isolation structure, extending to the isolation structure;
   the isolation structure comprises an angulated surface profile in proximity to the active region, extending to the active region; and
   the first part of the dielectric layer is above at least one of the angulated surface profiles of the active region and isolation structure.

9. The device as claimed in claim 6, wherein the substantially thickness-variation part of the second dielectric layer is approximately 10 Å higher than the substantially thickness-constant part of the second dielectric layer.

10. The device as claimed in claim 6, wherein the first part of the second dielectric layer is between 1.1 and 4.0 times thicker than the second part of the second dielectric layer.

11. The device as claimed in claim 6, wherein the thickness of the first part of the second dielectric layer is between 0.65 and 2.8 times of that of the second part of the second dielectric layer.

12. A semiconductor device, comprising:
    an active region isolated by an isolation structure on a substrate;
    a first dielectric layer covering the active region and the isolation structure, and said first dielectric layer physically contacting a top surface of the substrate; and
    a second dielectric layer overlying the first dielectric layer and the active region; wherein the first dielectric layer comprises:
    a first part, comprising a substantially stepped profile, at the boundary of the active region and the isolation structure; and
    a second part, comprising a substantially thickness-constant profile, on the isolation structure beyond the boundary of the active region and the isolation structure.

13. The device as claimed in claim 12, wherein
    the active region comprises an angulated surface profile in proximity to the isolation structure, extending to the isolation structure;
    the isolation structure comprises an angulated surface profile in proximity to the active region, extending to the active region; and
    the boundary of the active region and the isolation structure comprises the extension of the angulated surface profiles of the active region and isolation structure.

14. The device as claimed in claim 12, wherein the second dielectric layer comprises:
    a first part, comprising a substantially curved surface profile, overlying the first part of the first dielectric layer; and
    a second part, comprising a substantially flat surface profile, overlying the active region beyond the boundary of the active region and the isolation structure.

15. The device as claimed in claim 14, wherein
the second part of the first dielectric layer is between 30 and 110 Å thick;
the second part of the second dielectric layer is between 15 and 100 Å thick; and
the combination thickness of the first part of the first dielectric layer and the first part of the second dielectric layer is between 1.1 and 4.0 times of the thickness of the second part of the second dielectric layer.

16. The device as claimed in claim 14, wherein
the second part of the first dielectric layer is between 100 and 250 Å thick;
the second part of the second dielectric layer is between 100 and 1500 Å thick; and
the combination thickness of the first part of the first dielectric layer and the first of the second dielectric layer is between 0.65 and 2.8 times of the thickness of the second part of the second dielectric layer.

17. The device as claimed in claim 14, wherein
the first dielectric layer further comprises a third part, comprising a substantially thickness-constant profile and thinner than the second part of the first dielectric layer, overlying the active region beyond the boundary of the active region and the isolation structure;
the second part of the first dielectric layer is between 30 and 110 Å thick;
the second part of the second dielectric layer is between 15 and 100 Å thick; and
the combination thickness of the first part of the first dielectric layer and the first part of the second dielectric layer is between 1.1 and 4.0 times of the combination thickness of the third part of the first dielectric layer and the second part of the second dielectric layer.

18. The device as claimed in claim 14, wherein
the first dielectric layer further comprises a third part, comprising a substantially thickness-constant profile and thinner than the second part of the first dielectric layer, overlying the active region beyond the boundary of the active region and the isolation structure;
the second part of the first dielectric layer is between 100 and 250 Å thick;
the second part of the second dielectric layer is between 100 and 1500 Å thick; and
the combination thickness of the first part of the first dielectric layer and the first part of the second dielectric layer is between 0.65 and 2.8 times of the combination thickness of the third part of the first dielectric layer and the second part of the second dielectric layer.

19. The device as claimed in claim 12, wherein the semiconductor device is fabricated by steps of:
providing the substrate, the first dielectric layer overlying the active region and the isolation structure, and a hard mask dielectric layer overlying the first dielectric layer;
forming a patterned mask layer overlying the substrate, the patterned mask layer covering the hard mask dielectric layer overlying the isolation structure, and the boundary of the active region and the isolation structure, exposing the hard mask dielectric layer overlying the active region beyond the boundary;
removing the exposed hard mask dielectric layer and thinning the underlying first dielectric layer;
trimming back the patterned mask layer, removing the pattern mask layer overlying the boundary of the active region and the isolation structure, exposing the hard mask dielectric layer overlying the boundary of the active region and the isolation structure;
removing the exposed hard mask dielectric layer, forming the first and second parts of the first dielectric layer; and
forming the second dielectric layer overlying the first dielectric layer and the active region.

20. The device as claimed in claim 19, wherein the semiconductor device is fabricated by steps of:
providing the substrate, the first dielectric layer overlying the active region and the isolation structure, and a hard mask dielectric layer overlying the first dielectric layer;
forming a patterned mask layer overlying the substrate, the patterned mask layer covering the hard mask dielectric layer overlying the isolation structure, and the boundary of the active region and the isolation structure, exposing the hard mask dielectric layer overlying the active region beyond the boundary;
removing the exposed hard mask dielectric layer and thinning the underlying first dielectric layer;
laterally removing the hard mask dielectric layer overlying the boundary of the active region and the isolation structure, forming the first and second parts of the first dielectric layer; and
forming the second dielectric layer overlying the first dielectric layer and the active region.

21. A semiconductor device, comprising:
an active region isolated by a protruded isolation structure on a substrate;
a first dielectric layer covering the active region and the protruded isolation structure, and said first dielectric layer physically contacting a top surface of the substrate; and
a second dielectric layer overlying the first dielectric layer and the active region; wherein the first dielectric layer comprises:
a first part, comprising a substantially stepped profile, at the boundary of the active region and the protruded isolation structure; and
a second part, comprising a substantially thickness-constant profile, on the protruded isolation structure beyond the boundary of the active region and the protruded isolation structure.

* * * * *